US006787827B2

(12) United States Patent
Inumiya et al.

(10) Patent No.: US 6,787,827 B2
(45) Date of Patent: Sep. 7, 2004

(54) SEMICONDUCTOR DEVICE AND METHOD FOR MANUFACTURING THE SAME

(75) Inventors: Seiji Inumiya, Tokyo (JP); Katsuhiko Hieda, Yokohama (JP); Tetsuo Matsuda, Gunma-ken (JP); Yoshio Ozawa, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/132,255

(22) Filed: Apr. 26, 2002

(65) Prior Publication Data

US 2002/0117698 A1 Aug. 29, 2002

Related U.S. Application Data

(62) Division of application No. 09/621,450, filed on Jul. 21, 2000, now Pat. No. 6,403,997, which is a division of application No. 09/106,208, filed on Jun. 29, 1998, now Pat. No. 6,251,763.

(30) Foreign Application Priority Data

Jun. 30, 1997 (JP) .............................................. 9-174198

(51) Int. Cl.⁷ ...................... H01L 29/76; H01L 31/062; H01L 21/336; H01L 21/3205
(52) U.S. Cl. ...................... 257/288; 438/287; 438/591; 438/595
(58) Field of Search ................................. 257/402, 410, 257/288, 295, 344, 389, 324, 387, E21.444, E21.453, E29.133, E29.152, 411, 412, 773; 438/183, 197, 288, 591, 624, 627

(56) References Cited

U.S. PATENT DOCUMENTS

| | | | | |
|---|---|---|---|---|
| 4,198,252 A | * | 4/1980 | Hsu | 438/287 |
| 5,371,391 A | * | 12/1994 | Sato | 257/387 |
| 5,698,883 A | * | 12/1997 | Mizuno | 257/344 |
| 5,780,896 A | * | 7/1998 | Ono | 257/344 |
| 5,821,594 A | * | 10/1998 | Kasai | 257/410 |
| 5,825,609 A | | 10/1998 | Andricacos et al. | |
| 5,925,912 A | * | 7/1999 | Arai et al. | 257/344 |
| 5,981,993 A | | 11/1999 | Cho | |
| 6,137,149 A | * | 10/2000 | Kodama | 257/408 |
| 6,210,999 B1 | * | 4/2001 | Gardner et al. | 438/183 |
| 6,278,164 B1 | | 8/2001 | Hieda et al. | |
| 6,368,950 B1 | * | 4/2002 | Xiang et al. | 438/592 |
| 6,403,426 B1 | * | 6/2002 | Montree et al. | 438/291 |
| 6,436,746 B1 | * | 8/2002 | Chatterjee et al. | 438/299 |
| 6,465,309 B1 | * | 10/2002 | Xiang et al. | 438/299 |
| 6,476,454 B2 | * | 11/2002 | Suguro | 257/410 |
| 6,602,781 B1 | * | 8/2003 | Xiang et al. | 438/655 |
| 6,627,488 B2 | * | 9/2003 | Lee | 257/330 |
| 6,664,592 B2 | * | 12/2003 | Inumiya et al. | 257/330 |

FOREIGN PATENT DOCUMENTS

| | | |
|---|---|---|
| GB | 2251123 A | 6/1992 |
| JP | 62140464 A | 6/1987 |
| JP | 3-248433 | 11/1991 |
| JP | 5121714 A | 5/1993 |
| JP | 10223771 A | 8/1998 |

* cited by examiner

Primary Examiner—George Fourson
Assistant Examiner—Brook Kebede
(74) Attorney, Agent, or Firm—Finnegan, Henderson, Farabow, Garrett & Dunner, L.L.P.

(57) ABSTRACT

A method of manufacturing a semiconductor device comprising the steps of forming a dummy film and a dummy gate pattern at a predetermined gate-forming region on a semiconductor substrate, forming a first side wall insulating film on a side wall of the dummy gate pattern, forming an interlayer insulating film on a portion of the semiconductor substrate around the dummy gate pattern bearing the first side wall insulating film, forming a groove by removing the dummy gate pattern, removing a portion of dummy film exposed through the groove while leaving a portion of the first side wall insulating film as well as a portion of the dummy film disposed below the portion of the first side wall insulating film, forming a gate insulating film at least on a bottom surface of the groove, and forming a gate electrode on the gate insulating film formed in the groove.

6 Claims, 8 Drawing Sheets

US 6,787,827 B2

1

SEMICONDUCTOR DEVICE AND METHOD FOR MANUFACTURING THE SAME

This is a divisional of application Ser. No. 09/621,450, filed Jul. 21, 2000, now U.S. Pat. No. 6,403,997, which is a divisional of application No. 09/106,208, filed Jun. 29, 1998 (now U.S. Pat. No. 6,251,763) which are incorporated herein by reference.

BACKGROUND OF THE INVENTION

This invention relates to a semiconductor device and the method of manufacturing the semiconductor device.

The improvement in reliability of a gate oxide film in a MOS transistor where a silicon oxide film is employed as the gate oxide film is one of important factors in enhancing the performance of the MOS transistor. However, the thinning of the gate oxide film is considered to invite a problem of deteriorating the reliability of the gate film (e.g. the deterioration of TDDB, an increase in leak current, or the deterioration of dielectric strength) that may be brought about by a plasma damage at the occasion of introducing an impurity into a gate electrode or at the occasion of working a gate electrode, or by an ion damage at the occasion of implanting ions into a channel region and into a source/drain region.

There has been proposed, as one of the solutions to overcome the aforementioned problem, a method of forming a gate electrode using a dummy gate pattern (e.g. Japanese Patent Application H/8-356493). This method is featured in that a dummy gate pattern is formed via a pad oxide film at a predetermined gate region on a semiconductor substrate at first, and, after finishing the implantation of ions into a channel region and a source/drain region, the dummy gate pattern and the pad oxide film are removed to form a groove, in which a gate insulating film and a gate electrode are subsequently formed by means of CMP. According to this method, it is possible to avoid the gate insulating film from being damaged, i.e. to obviate the aforementioned plasma damage at the occasion of working a gate electrode, or the aforementioned ion damage at the occasion of implanting ions into a channel region and into a source/drain region.

However, this method is accompanied with a problem that it is difficult to control the dimension of the gate electrode. Specifically, since the etching rate of an $SiO_2$ film (interlayer insulating film) formed around the dummy gate pattern is higher than that of the pad oxide film ($SiO_2$ thermal oxide film), the interlayer insulating film is caused to become thinner extremely at the occasion of removing the pad oxide film, thus resulting in a great change in width of the groove for forming a gate electrode therein.

As a countermeasure to cope with this problem, it is conceivable to form an SiN film on the side wall of the dummy gate pattern. FIG. 1 illustrates the construction of one example of a transistor provided on its side wall with such an SiN film. In FIG. 1, the reference numeral 101 denotes a gate electrode, the numeral 102 a gate insulating film, the numeral 103 a source/drain diffusion layer, the numeral 104 a side wall insulating film, and the numeral 105 a pad oxide film.

However, even if the side wall insulating film (SiN film) 104 is provided in this manner, the oxide film 105 formed below the side SiN film 104 is caused to set back (to become thinner) at the occasion of removing an exposed portion of the pad oxide film disposed below the dummy gate pattern, thereby forming a recessed portion 106 at the lower edge portion of the gate electrode 101. As a result, a dielectric

2 strength between the source/drain region 103 and the gate electrode 101 may be deteriorated, or the film thickness of the gate insulating film 102 at the lower edge portion of the gate electrode 101 may be caused to change.

As a result, there will be raised a serious problem such as a deterioration in property (a reduction of channel current, an increase of interfacial level, etc.) or in reliability (a lowering of insulating property due to an electrostatic focusing at the lower edge portion of the gate electrode or due to a poor filling of gate insulating film) of a transistor. Furthermore, due to the formation of the recessed portion 106 at the lower edge portion of gate electrode, the bottom width of groove to be filled with a gate electrode may be caused to change, thus making it difficult to control the dimension of the gate electrode also in this case.

As explained above, a method comprising the steps forming a pad oxide film (a dummy insulating film) and a dummy gate pattern in a predetermined gate region, removing the dummy gate pattern and the dummy insulating film thereby forming a groove, and then forming a gate insulating film and a gate electrode in the groove is accompanied with a problem that the controlling of dimension of the groove, i.e. the controlling of dimension of the gate electrode is difficult.

Further, a method of forming an SiN film on the side wall of a dummy gate pattern is also accompanied with a problem as mentioned above that a dummy insulating film is laterally etched at the occasion of removing an exposed portion of the dummy insulating film, thus forming a recessed portion at the lower edge portion of the gate electrode whereby raising problems of deteriorating the performance and reliability of the resultant transistor. Additionally, due to the generation of this recessed portion, the controlling of dimension of gate electrode also becomes difficult.

On the other hand, with a view to enhance the performance of a semiconductor integrated circuit using an MIS type transistor, there has been tried to reduce the film thickness of an effective gate insulating film by employing at least partially a low resistance metallic material for the gate electrode, or by employing at least partially a ferro-electric film such as $Ta_2O_5$ for the gate insulating film. In this case, for the purpose of avoiding a deterioration of the properties of gate electrode/gate insulating film at the occasion of a high temperature processing such as the activation of source/drain region, a method has been proposed wherein the source/gate drain regions are formed in advance and then a groove is formed in self-alignment at a predetermined gate-forming region in relative to the source/drain, a gate insulating film and a gate electrode being subsequently buried in the groove as mentioned above.

Next, a typical example of the manufacturing process of a semiconductor device according to the prior art will be explained with reference to FIGS. 2A to 2J.

As shown in FIG. 2A, an $SiO_2$ film 112 having a thickness of 5 nm is formed on the surface of a predetermined transistor-forming region of a Si substrate 111 provided with a trench type element isolation layer (not shown). Then, a poly-Si film 113 having a film thickness of 300 nm for forming a dummy gate pattern is deposited on this $SiO_2$ film 112.

Then, as shown in FIG. 2B, the poly-Si film 113 is worked into a dummy gate pattern by means of lithography and RIE for instance. Subsequently, as shown in FIG. 2C, an ion-implantation of phosphorus ion is performed for instance at a dosage of $4 \times 10^{13} cm^{-2}$ using the dummy gate pattern 113 as a mask to form n-type source/drain regions 114.

After an $Si_3N_4$ film is deposited all over the upper surface of the resultant substrate, an overall etch-back is performed thereby to form an $Si_3N_4$ side wall 115 on the side wall of the dummy gate pattern 113. Thereafter, an ion-implantation of arsenic ion is performed for instance at a dosage of $5 \times 10^{15} cm^{-2}$ to form n+ type source/drain regions 116 thereby forming an LDD structure as shown in FIG. 2D. Subsequently, an annealing is performed for 30 seconds at a temperature of 1,000° C. to activate the source/drain regions.

Thereafter, as shown in FIG. 2E, a $CVD-SiO_2$ film 117 is deposited entirely to a thickness of 300 nm for instance, and then densified over a period of 30 minutes in a N2 gas atmosphere at a temperature of 800° C. for instance. Then, the upper surface of the resultant substrate is flattened by entirely performing a chemical and mechanical abrasion, whereby allowing the upper surface of the dummy gate pattern 113 to expose.

Then, as shown in FIG. 2F, the exposed dummy gate pattern 113 is selectively removed, and the $SiO_2$ film 112 disposed below the dummy gate pattern 113 is also removed thereby to form a groove 118 for forming a gate insulating film and a gate electrode.

After a $Ta_2O_5$ film 119 is entirely deposited to a thickness of 20 nm as a gate insulating film, a Ru film 120 is entirely deposited to a thickness of 300 nm as a gate electrode, and the resultant upper surface is entirely abraded by chemical and mechanical means, thereby forming a transistor structure as shown in FIG. 2G wherein the gate insulating film 119 and the gate electrode 120 are buried in the groove 118. Thereafter, though not shown, ordinary procedures such as the deposition of insulating interlayer film, the formation of contact holes in the interlayer film and the formation of wiring through the contact holes are performed.

However, as mentioned above, the $SiO_2$ film 112 is laterally etched at the occasion of removing an exposed portion of the $SiO_2$ film 112 as shown as an enlarged view in FIG. 2H, thereby forming a laterally recessed portion 121 in the groove 118 for housing the gate electrode and the gate insulating film therein. As a result, when the gate insulating film 119 and the gate electrode 120 are successively formed in the groove 118, a hollow portion 122, i.e. a defective filling of gate electrode 120 is caused to generate as shown in FIG. 2I, or the radius of curvature of the lower corner portion 123 of the gate electrode 120 is caused to reduce as shown in FIG. 2J.

As a result, a transistor to be obtained would be poor in dielectric strength at the gate edge portion of the gate insulating film, i.e. poor in reliability.

BRIEF SUMMARY OF THE INVENTION

Therefore, an object of this invention is to provide a semiconductor device which is free from deterioration in property and reliability that might be brought about due to a recessed portion at a lower edge portion of gate electrode to be generated at the occasion of forming a gate electrode.

Another object of this invention is to provide a method of manufacturing a semiconductor device which is free from deterioration in property and reliability that might be brought about due to a recessed portion at a lower edge portion of gate electrode to be generated at the occasion of forming a gate electrode via a gate insulating film in the region of semi-conductor substrate where a dummy gate pattern and a dummy insulating film (dummy film) once formed are removed.

Still another object of this invention is to provide a method of manufacturing a semiconductor device which enables to form a gate electrode with a high controllability.

Namely, this invention provides a method of manufacturing a semiconductor device comprising the steps of:

forming a dummy film and a dummy gate pattern at a gate-forming region on a semiconductor substrate;

forming a first side wall insulating film on a side wall of the dummy gate pattern;

forming an interlayer insulating film on a portion of the semiconductor substrate around the dummy gate pattern bearing the first side wall insulating film;

forming a groove by removing the dummy gate pattern;

removing a portion of dummy film exposed through the groove while leaving a portion of the first side wall insulating film as well as a portion of the dummy film disposed below the portion of the first side wall insulating film;

forming a gate insulating film at least on a bottom surface of the groove; and forming a gate electrode on the gate insulating film formed in the groove.

This invention also provides a semiconductor device comprising:

a semiconductor substrate;

a gate electrode formed on a surface of the semiconductor substrate;

a gate insulating film formed at an interface between the semiconductor substrate and the gate electrode, and also on a side wall of the gate electrode;

a first side wall insulating film formed on a portion of the gate insulating film which is formed on the side wall of gate electrode;

a second side wall insulating film formed on the first side wall insulating film;

a residual film formed at an interface between the first and second side wall insulating films and the semiconductor substrate; and an interlayer insulating film formed around the gate electrode where the first and second side wall insulating films are formed.

Furthermore, this invention provides a method of manufacturing a semiconductor device comprising the steps of:

forming a dummy film and a dummy gate pattern at a gate-forming region on a semiconductor substrate;

modifying at least a lower edge portion of the dummy gate pattern;

forming an interlayer insulating film on a portion of the semiconductor substrate around the dummy gate pattern;

forming a groove by removing the dummy gate pattern while leaving the modified portion of the dummy gate pattern;

removing a portion of dummy film exposed through the groove;

forming a gate insulating film at least on a bottom surface of the groove; and forming a gate electrode on the gate insulating film formed in the groove.

This invention also provides a method of manufacturing a semiconductor device comprising the steps of:

forming a dummy film and a dummy gate pattern at a gate-forming region on a semiconductor substrate;

introducing an impurity into at least a portion of the dummy film located near a lower edge portion of the dummy gate pattern;

forming an interlayer insulating film around the dummy gate pattern;

forming a groove by removing the dummy gate pattern while leaving the impurity-doped portion of the dummy gate pattern;

removing a portion of dummy film exposed through the groove;

forming a gate insulating film at least on a bottom surface of the groove; and forming a gate electrode on the gate insulating film formed in the groove.

This invention further provides a method of manufacturing a semiconductor device comprising the steps of:

forming a dummy film and a dummy gate pattern at a gate-forming region on a semiconductor substrate;

removing at least a portion of the dummy film located near a lower edge portion of the dummy gate pattern;

forming an insulating film at a portion where the dummy film is removed;

forming an interlayer insulating film on a portion of the semiconductor substrate around the dummy gate pattern;

forming a groove by removing the dummy gate pattern while leaving the insulating film;

removing a portion of dummy film exposed through the groove;

forming a gate insulating film at least on a bottom surface of the groove; and forming a gate electrode on the gate insulating film formed in the groove.

This invention also provides a semiconductor device comprising:

a semiconductor substrate;

a gate electrode formed on a surface of the semiconductor substrate;

a gate insulating film formed at an interface between the semiconductor substrate and the gate electrode, and also on a side wall of the gate electrode; and an interlayer insulating film formed on a portion of the semiconductor substrate around the gate electrode;

wherein a thickness of an insulating region including a portion of the gate insulating film which is located near a lower edge portion of the gate electrode is larger than a thickness of a portion of the gate insulating film which is located below a central portion of the gate electrode.

This invention also provides a semiconductor device comprising:

a semiconductor substrate;

a first insulating film selectively formed on a surface of the semiconductor substrate;

a gate insulating film selectively formed on a surface portion of the semiconductor substrate where the first insulating film is not formed;

a gate electrode formed on the gate insulating film;

a second insulating film formed on a side wall of the gate electrode;

a side wall insulating film which is formed on the second insulating film formed on the side wall of gate electrode; and an interlayer insulating film formed around the gate electrode where the second insulating film and the side wall insulating film are formed;

wherein a total film thickness of the gate insulating film and the second insulating film is larger than a film thickness of the first insulating film.

Furthermore, this invention provides a semiconductor device comprising:

a semiconductor substrate;

a first insulating film selectively formed on a surface of the semiconductor substrate;

a gate insulating film selectively formed on a surface portion of the semiconductor substrate where the first insulating film is not formed;

a gate electrode formed on the gate insulating film;

a second insulating film formed on a side wall of the gate electrode;

a side wall insulating film which is formed on the second insulating film formed on the side wall of gate electrode; and an interlayer insulating film formed around the gate electrode where the second insulating film and the side wall insulating film are formed;

wherein a total film thickness of the gate insulating film and the second insulating film is larger than a distance between a lower edge portion of the side wall insulating film facing the gate electrode and the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
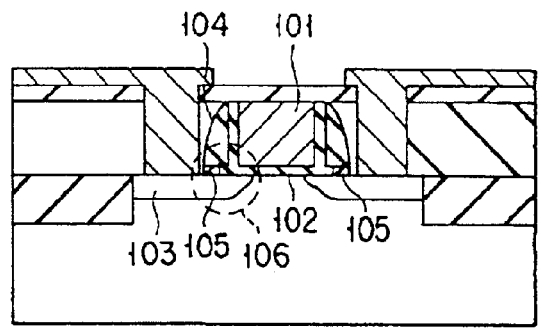
FIG. 1 is a cross-sectional view of a conventional transistor wherein an SiN film is formed on the side wall of a dummy gate pattern.
Figure 2A:
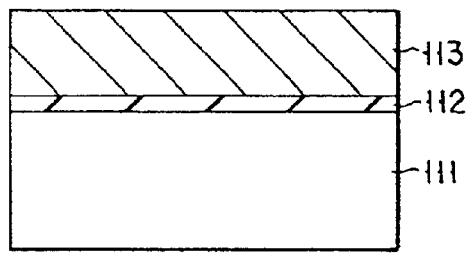
FIGS. 2A to 2J are cross-sectional views showing in stepwise a method of manufacturing a conventional semiconductor device wherein a ferroelectric film is partially employed for a gate insulating film so as to minimize the film thickness of the gate insulating film.
Figure 2B:
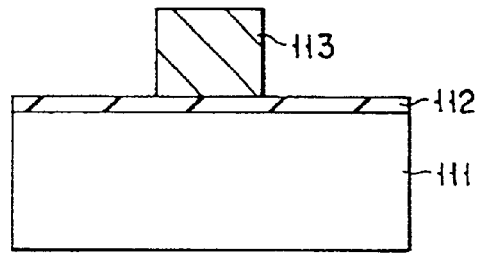
Figure 2C:
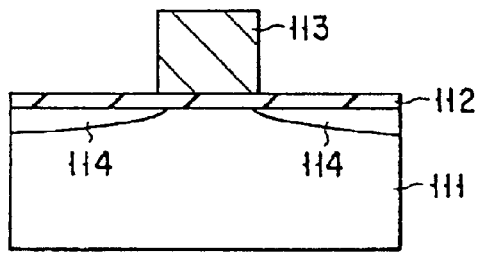
Figure 2D:
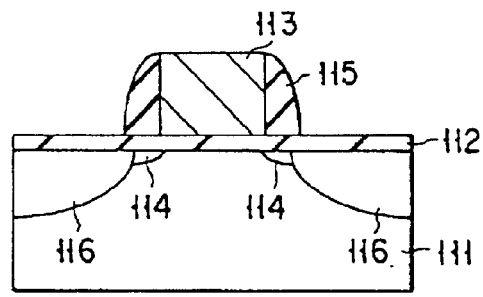
Figure 2E:
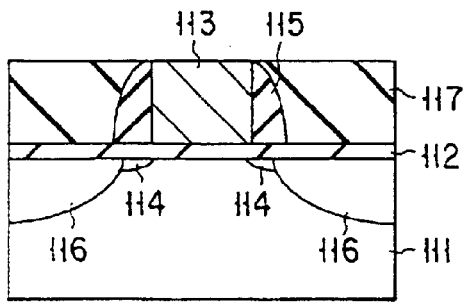
Figure 2F:
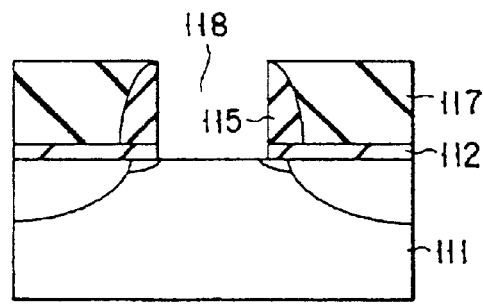
Figure 2G:
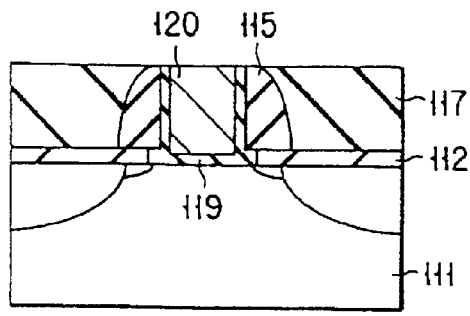
Figure 2H:
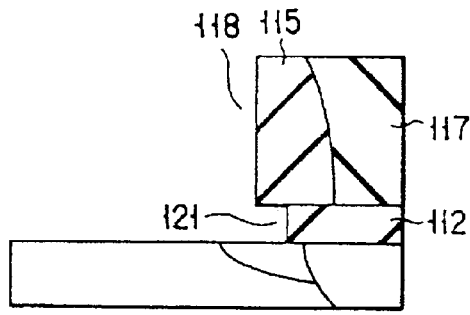
Figure 2I:
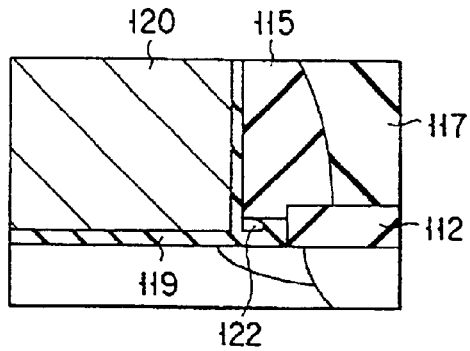
Figure 2J:
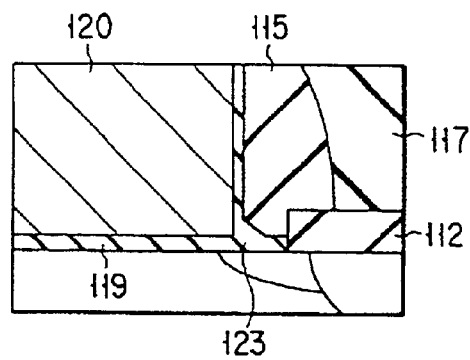

In the method of manufacturing a semiconductor device according to a first embodiment of this invention, a side wall insulating film is formed on a side wall of a dummy gate pattern, and the removal of a dummy film in subsequent to the removal of the dummy gate pattern is performed in such a manner that a portion of the first side wall insulating film as well as a portion of the dummy film that is disposed below the aforementioned portion of the first side wall insulating film are left remained.

According to a first embodiment of the method of manufacturing a semiconductor device of this invention, since a first side wall insulating film is formed on the side wall of a dummy pattern, the dummy gate pattern and the dummy film can be removed using a stable process which is not severe in conditions, thus making it possible to improve the dimension controllability of the groove portion to be filled with a gate electrode, i.e. the dimension controllability of the gate electrode.

Furthermore, when the dummy film is formed using a material which can be etched at the same etching rate as that of a material employed for the first side wall insulating film, it is possible to leave a portion of the dummy film below the first side wall insulating film formed on the side wall of the gate electrode, whereby making it possible to prevent the generation of recessed portion at the lower edge portion of the gate electrode. As a result, it is possible, without necessitating a post oxidation, to prevent the deterioration of property or reliability of transistor that might be brought about due to an undesirable shape of the lower edge portion of the gate electrode.

Followings are specific embodiments of this first embodiment of the manufacturing method of semiconductor device according to this invention.

(1) It further includes a step of forming a second side wall insulating film on the surface of the first side wall insulating film.

(2) It is designed such that the etching rate of the first side wall insulating film is approximately the same as that of the dummy film.

(3) It further includes a step of doping the semiconductor substrate with an impurity with the dummy gate pattern being employed as a mask thereby to form source/drain regions.

(4) The dummy gate pattern is formed of an amorphous silicon.

(5) The first side wall insulating film is formed through a thermal oxidation of the dummy gate pattern.

(6) The dummy gate pattern is formed of an amorphous silicon film. When the dummy gate pattern is formed of an amorphous silicon film of small grain diameter, the roughness of the edge portion of amorphous silicon film pattern can be minimized at the occasion of patterning.

(7) The dummy gate pattern is formed of a silicon film (more preferably, amorphous silicon film), and the first side wall insulating film is formed of a thermally oxidized silicon film.

When the first side wall insulating film is formed of a thermally oxidized silicon film, the first side wall insulating film can be etched at the same etching rate as that of the dummy film formed of a thermally oxidized silicon film, so that it becomes certainly possible to prevent the generation of a recessed portion at the lower edge portion of the gate electrode.

(8) The gate insulating film is formed of a deposition film selected from the group consisting of a $CVD-SiO_2$ film; a CVD-SiON film; a $CVD-Si_3N_4$ film; a laminate film comprising any one of these $CVD-SiO_2$, CVD-SiON and $CVD-Si_3N_4$ films; a ferroelectric film formed by means of CVD (such as a $Ta_2O_5$ film or a $(Ba, Sr)TiO_3$ film); and a laminate film comprising this ferroelectric film.

Especially, when a ferroelectric film is employed as a gate insulating film, it is possible to reduce the effective film thickness of the gate insulating film without inviting an increase in leak current or a deterioration of dielectric strength.

In a semiconductor device according to a second embodiment of this invention, a first side wall insulating film and a second side wall insulating film are formed on the side wall of a gate electrode, and at the same time, a residual film is left remained at an interface between these first and second side wall insulating films and a semiconductor substrate.

According to a semiconductor device of this construction, since the side wall of the gate electrode is covered by these first and second side wall insulating films as well as by a residual film disposed below these insulating films, it is possible to prevent the deterioration of property or reliability of transistor that might be brought about due to an undesirable shape of the lower edge portion of the gate electrode.

In the method of manufacturing a semiconductor device according to a third embodiment of this invention, since a modified film portion is left remained at the lower edge portion of the groove at the occasion of removing the dummy film so as to make it possible to prevent the set-back of the dummy film, it is possible to prevent the generation of recessed portion at the lower edge portion of gate electrode at the occasion of removing the dummy film. Accordingly, it is possible to allow the insulating film portion disposed at the lower edge portion of gate electrode to become thick and at the same time, to allow the lower edge portion of gate electrode to become large in radius of curvature. As a result, it is possible, without necessitating a post oxidation, to prevent the deterioration of property or reliability of transistor, e.g. a lowering of dielectric strength that might be brought about due to an undesirable shape of the lower edge portion of the gate electrode.

It is preferable in this method that a silicon film (a monocrystalline silicon film, a polycrystalline silicon film or an amorphous silicon film) is employed as the dummy gate pattern, that a silicon oxide film is employed as the dummy film, and that the step of modifying at least the lower edge portion of dummy gate pattern is consisted of a process of thermally oxidizing a silicon film to be employed as the dummy gate pattern. When the modifying step is performed in this manner, an oxidizing agent is allowed to diffuse into the gate insulating film, so that the oxidation of the lower edge portion of the dummy gate pattern is also proceeded from the bottom of the dummy gate pattern, thus making it possible, through a simple step, to modify the lower edge portion of the dummy gate pattern into an insulating film.

In the case of the manufacturing method of a semiconductor device according to a fourth embodiment of this invention, since a portion of the dummy film which is doped with an impurity is left remained at the lower edge portion of the groove so as to inhibit the set-back of the dummy film, it possible to prevent the generation of recessed portion at the lower edge portion of the gate electrode. Accordingly, it is possible to allow the insulating film portion disposed at the lower edge portion of gate electrode to become thick and at the same time, to allow the lower edge portion of gate electrode to become large in radius of curvature. As a result, it is possible, without necessitating a post oxidation, to prevent the deterioration of property or reliability of transistor, e.g. a lowering of dielectric strength that might be brought about due to an undesirable shape of the lower edge portion of the gate electrode.

It is preferable in this method that a silicon oxide film is employed as the dummy film, and that the step of introducing an impurity into at least a portion of dummy field disposed at the lower edge portion of dummy gate pattern comprises a step of nitrogen or carbon ion implantation or a step of thermal nitridation. When the impurity doping step is performed in this manner, it is possible to leave a dummy film doped with an impurity at the lower edge portion of the dummy gate pattern at the occasion of removing the dummy film through a simple process excellent in etching controllability such as a dilute hydrofluoric acid treatment.

In the case of the manufacturing method of a semiconductor device according to a fifth embodiment of this invention, since an insulating film is left remained at the lower edge portion of the groove where the dummy film is removed therefrom at the occasion of removing the dummy film so as to inhibit the set-back of the dummy film, it possible to prevent the generation of recessed portion at the lower edge portion of the gate electrode. Accordingly, it is possible to allow the insulating film portion disposed at the lower edge portion of gate electrode to become thick and at the same time, to allow the lower edge portion of gate electrode to become large in radius of curvature. As a result, it is possible, without necessitating a post oxidation, to prevent the deterioration of property or reliability of transistor, e.g. a lowering of dielectric strength that might be brought about due to an undesirable shape of the lower edge portion of the gate electrode.

It is preferable in this method that a silicon oxide film is employed as the dummy film, and that the step of forming an insulating film at the lower edge portion of dummy gate pattern where the dummy film is removed comprises a step of forming a silicon nitride film. When an insulating film is formed in this manner, it is possible to leave an insulating film at the lower edge portion of the dummy gate pattern at the occasion of removing the dummy film through a simple process excellent in etching controllability such as a dilute hydrofluoric acid treatment.

It is preferable in any of the aforementioned manufacturing methods to include a step of forming source/drain diffusion layers on a portion of the semiconductor substrate located on both sides of the dummy gate pattern before the step of removing the dummy gate pattern.

In the case of a semiconductor device according to a sixth embodiment of this invention, the film thickness of the insulating region including the gate insulating film at the lower edge portion of the gate electrode is made larger than the film thickness of a portion of the gate insulating film which is located below the central portion of the gate electrode. It is preferable in this case that the radius of curvature of the lower edge portion of the gate electrode is larger than the film thickness of a portion of the gate insulating film which is located below the central portion of the gate electrode.

Figure 3:
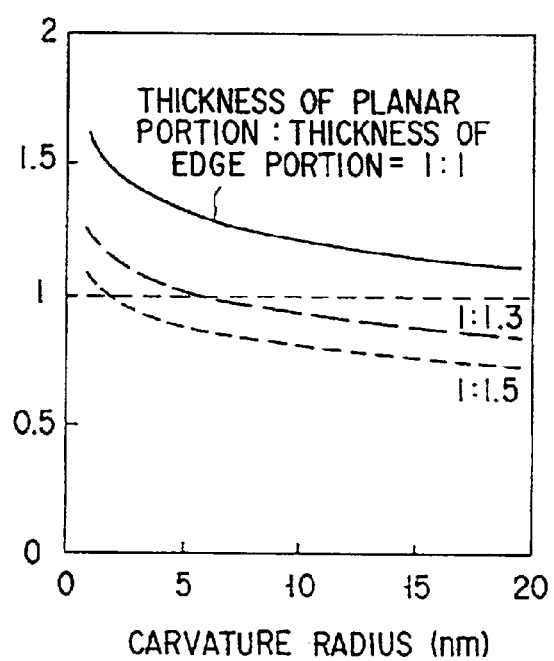
FIG. 3 is a graph showing an effect that can be brought about by an increase in radius of curvature of an edge portion of gate.
Figure 4:
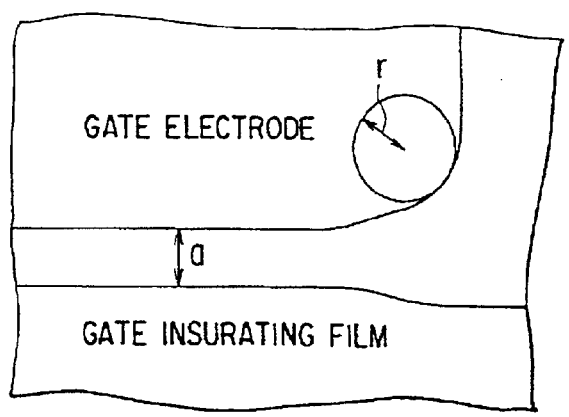
FIG. 4 is an enlarged cross-sectional view showing an edge portion of gate.

FIG. 3 shows a graph illustrating a relationship between a ratio of the electric field of lower edge portion of gate electrode/the electric field of flat portion of gate electrode and a radius of curvature of the lower edge portion of gate electrode in various ratios of the film thickness of flat portion/the film thickness of edge portion of the gate insulating film. The radius of curvature "r" and the film thickness "a" of the flat portion of gate insulating film are shown in FIG. 4. As seen from FIG. 3, the larger the film thickness of the lower edge portion is or the larger the radius of curvature of the edge portion is, the smaller the electric field of the edge portion becomes in relative to the electric field of the flat portion, thus proportionately reducing the electrostatic focusing at the edge portion.

Therefore, in a semiconductor device according to the sixth embodiment of this invention, the electric field of the lower edge portion of gate electrode is weakened (i.e. the electrostatic focusing is alleviated), and hence the insulating property (reliability) of the lower edge portion of the gate electrode can be improved.

In the case of a semiconductor device according to a seventh embodiment of this invention, the total film thickness of the gate insulating film and the second insulating film formed on the side wall of the gate electrode is larger than the film thickness of the first insulating film formed on a portion of the semiconductor substrate other than the gate portion. Alternatively, the total film thickness of the gate insulating film and the second insulating film formed on the side wall of the gate electrode is larger than a distance between the lower edge portion of the side wall insulating film facing the gate electrode and the semiconductor substrate.

According to the construction of this semiconductor device, the laterally recessed portion formed between the surface of silicon substrate and the side wall insulating film at the lower edge portion of gate is completely filled with the gate insulating film, thus forming an edge shape having a large radius of curvature and hence providing a semiconductor device having a gate edge portion of improved reliability.

Next, various examples of this invention will be explained with reference to the drawings.

At first, a first example of this invention will be explained.

Figure 5A:
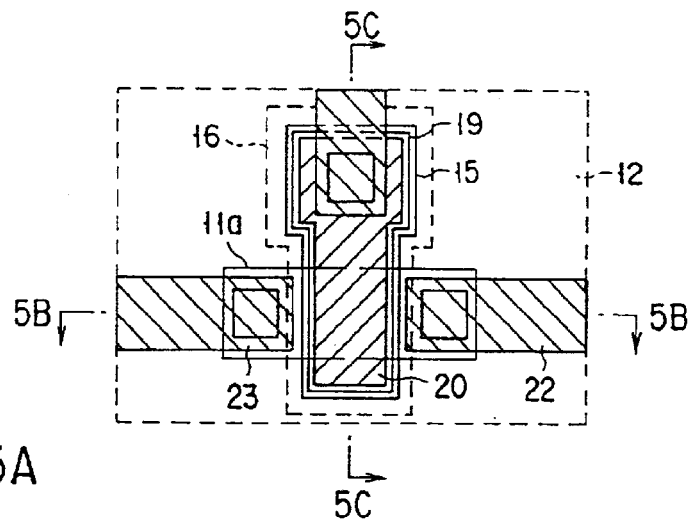
FIG. 5A is a plan view showing the construction of a semiconductor device according to a first example of this invention.
Figure 5B:
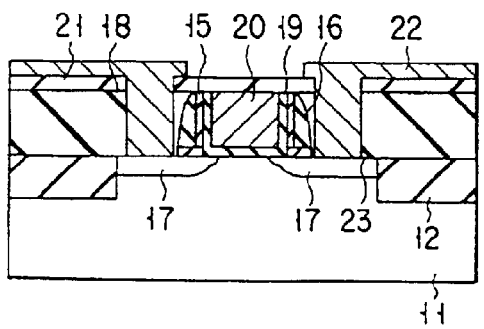
FIG. 5B is a cross-sectional view taken along the line 5B—5B of FIG. 5A.
Figure 5C:
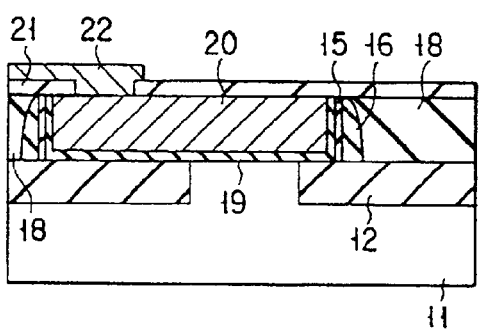
FIG. 5C is a cross-sectional view taken along the line 5C—5C of FIG. 5A.

Referring to FIGS. 5A to 5C, n-type diffusion regions 17 (to be formed into source/drain regions) each having an impurity concentration of $5 \times 10^{19}$ cm$^{-3}$ and a diffusion depth of 0.10 $\mu$m are formed in a predetermined element-forming region, which is isolated by an element isolation insulating film 12, of a p-type silicon substrate 11 having an impurity concentration of $1-5 \times 10^{15}$ cm$^{-3}$. Further, a p-type channel impurity region (not shown) having an impurity concentration of $5 \times 10^{17}$ cm$^{-3}$ for controlling the threshold voltage (Vth) of transistor is selectively formed only at the channel region between the source/drain regions.

A gate insulating film 19 consisting of an SiO$_2$ film having a film thickness of 5 nm for instance is formed on the channel region. Further, a gate electrode 20 consisting of a conductive film (such as a TiN film, a Ru film, a W film, a Cu film or a laminate including any of these films such as W/TiN) and having its bottom surrounded by the gate insulating film 19 and its side walls surrounded by the gate insulating film 19 and by part of an oxide film 15 formed through an oxidation of a dummy gate film is formed in a self-aligned manner in relative to the source/drain region 17.

The width L of gate in the direction of channel length is about 0.15 $\mu$m for instance. A wiring 22 is formed on an interlayer insulating film 21 and connected via a plug formed in the interlayer insulating film 21 with the gate electrode 20 and with the source/drain regions 17.

Next, the manufacturing process of the transistor shown in FIGS. 5A to 5C will be explained with reference to FIGS. 6A to 6H (cross-sectional views for explaining the manufacturing process, which correspond to the section taken along the line 5B—5B of FIG. 5A).

Figure 6A:
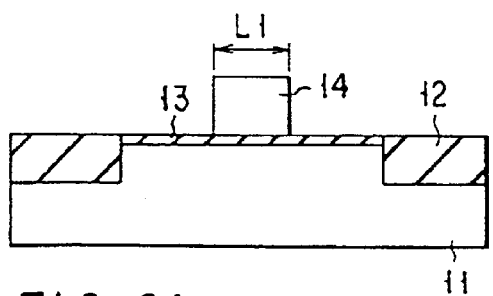
FIGS. 6A to 6H are cross-sectional views showing in stepwise a method of manufacturing a semiconductor device according to a first example of this invention.

First of all, as shown in FIG. 6A, a p-well (not shown) is formed in an n-channel transistor-forming region of the (100) plane of the p-type silicon substrate 11 having an impurity concentration of $5 \times 10^{15}$ cm$^{-3}$(this substrate may be a so-called epitaxial substrate where a p-type or n-type epitaxial Si layer is grown to a film thickness of 1 μm on the surface of an n-type silicon substrate or a p-type silicon substrate) and at the same time, an n-well (not shown) is formed likewise in a p-channel transistor-forming region of the (100) plane of the p-type silicon substrate 11.

Subsequently, a groove is formed in the Si substrate 11 by means of a reactive ion etching method (RIE) and then filled with an insulating film, thereby forming a so-called trench type element isolation layer 12 (an STI (Shallow Trench Isolation) having a depth of about 0.2 μm). Then, a pad oxide film (dummy insulating film) 13 consisting of SiO$_2$ and having a thickness of about 5 nm is formed through thermal oxidation.

Subsequently, an amorphous Si film 14 for forming a dummy gate pattern and having a thickness of 300 nm is deposited on this SiO$_2$ film 13. This amorphous Si film 14 is then etched by means of an RIE method using as a mask a resist pattern that has been formed by means of ordinary lithography, whereby forming a dummy gate pattern 14 to be ultimately removed in a subsequent step for forming a gate electrode. The dimension of the dummy gate pattern 14 at this occasion is defined as L1.

Since the dummy gate pattern 14 is constituted by an amorphous Si having a small grain size, the edge of the pattern of amorphous Si film formed at this occasion is featured as being minimal in roughness. Although the dummy gate pattern 14 is constituted by amorphous Si in this example, polycrystalline Si having small grain size may be substituted for he amorphous Si. When the dummy gate pattern 14 is constituted by a Si-based material, it becomes easy to set a high etching selectivity in relative to the SiO$_2$ film 13 at the occasion of treating the Si film by means of RIE, so that an etching damage (RIE) to the Si substrate 11 can be inhibited.

Figure 6B:
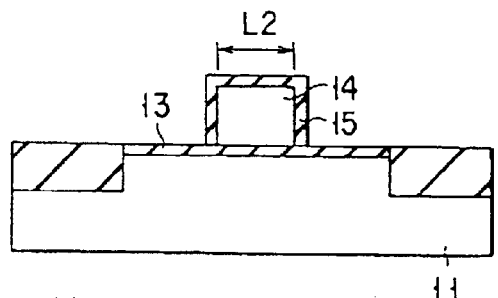

Next, as shown in FIG. 6B, the surface, of the dummy gate pattern 14 consisting of amorphous Si is thermally oxidized in an oxygen atmosphere at a temperature of 850° C. thereby to form an oxide film 15 having a film thickness of about 10 μm. The film thickness of the oxide film 15 should preferably be larger than the film thickness of the pad oxide film (e.g. 1.5 to 3 times as thick as the pad oxide film). If the dimension of dummy gate pattern 14 after oxidation is defined as L2, the dimension of L2 is made smaller than L1 by the dimension of the oxidized portion (L2<L1).

Figure 6C:
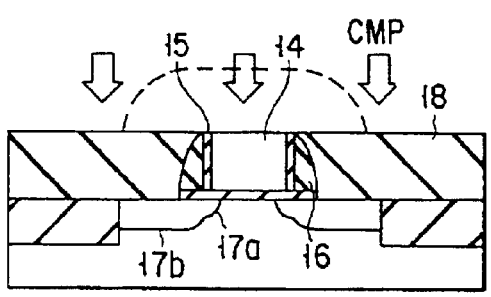

Next, as shown in FIG. 6C, for the purpose of forming an LDD (Lightly Doped Drain), phosphorus ion (P+) is implanted with an acceleration voltage of 70 keV and at a dosage of $4 \times 10^{13}$ cm$^{-2}$, in the case of forming an n-type channel transistor, using the dummy gate pattern 14 and the SiO$_2$ 15 as a mask thereby to form an n$^-$-type diffusion region 17a. Then, after an Si$_3$N$_4$ film (or an SiO$_2$ film) is entirely deposited, the entire surface is subjected to an RIE process, thus leaving a portion of the Si$_3$N$_4$ film (or an SiO$_2$ film) on the side wall of the dummy gate pattern (a step of leaving a side wall portion), whereby forming a side wall insulating film 16 having a film thickness of 20 nm on the SiO$_2$ film 15 which is formed in advance on the side wall of the dummy gate pattern 14.

Subsequently, arsenic ion (As+) is implanted for instance with an acceleration voltage of 30 keV and at a dosage of $5 \times 10^{15}$ cm$^{-2}$using the dummy gate pattern 14 and the side wall insulating film 16 as a mask thereby to form an n$^+$-type diffusion region 17b whereby completing the LDD structure. Although the LDD structure has been adopted in this example, it is possible to adopt a so-called single source/drain structure comprising only an n$^-$-type diffusion region or only an n$^+$-type diffusion region.

Subsequently, a CVD-SiO$_2$ film 18 to be formed into an interlayer insulating film is entirely deposited to a thickness of 400 nm and then subjected to a densification treatment for 30 minutes in a N$_2$ gas atmosphere at a temperature of 800° C. This heating step is also aimed at activating the ion implantation region of the source/drain regions. If the depth (Xj) of the diffusion region is desired to be limited, the temperature for the densification should be decreased down to about 750° C., and the activation of the ion implantation region may be performed by additionally performing an RTA (Rapid Thermal Anneal) for seconds at a temperature of 950° C.

Thereafter, the entire surface is subjected to CMP (Chemical Mechanical Polishing) to flatten the upper surface of the resultant structure thereby to allow the surface of the dummy gate pattern 14 to be exposed.

Figure 6D:
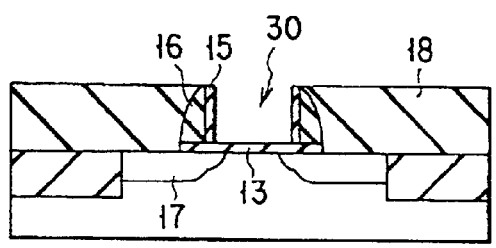

Then, as shown in FIG. 6D, the dummy gate pattern 14 is selectively etched in relative to an oxide film, etc. by means of a CDE (Chemical Dry Etching) method or a wet etching method employing a KOH solution, thereby to form a groove 30. Thereafter, only a desired channel region is subjected to a channel ion implantation using, as a mask, a resist and films, such as a resist pattern (not shown) formed at a desired region, the SiO$_2$ film 18 to be employed as an interlayer insulating film, the side wall insulating film 16 and the SiO$_2$ film 15. In the case of n-channel transistor, for the purpose of setting a threshold voltage (Vth) of about 0.7V, boron ion (B+) is implanted for instance with an acceleration voltage of 10 keV and at a dosage of $5 \times 10^{12}$ cm$^{-2}$ thereby to selectively form an p-type channel impurity region (not shown) only at a channel region.

This step of ion implantation may be performed through the SiO$_2$ film 13. Alternatively, the. implantation may be performed through a newly formed SiO$_2$ film which has been formed after the SiO$_2$ film 13 is removed. The activation of the channel impurity region after the ion implantation can be performed by means of the RTA, i.e. a heat treatment at a temperature of 800° C. for 10 seconds or so. Since any further heat treatment at a high temperature is no more required to be performed thereafter, the short channel effect of transistor can be suppressed and the impurity profile of the channel region can be optimized.

Figure 6E:
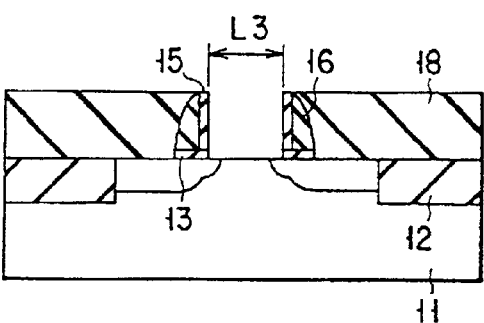

Then, as shown in FIG. 6E, the pad oxide film 13 formed at the bottom of the groove is removed. Since both oxide film 15 formed on the side wall of the groove and pad oxide film 13 are formed of a thermal oxide film, they can be etched at almost the same etching rate. However, since the film thickness of the side wall oxide film 15 is larger than the film thickness of the pad oxide film 13, part of the side wall oxide film 15 is left remained on the side wall of the groove even after the pad oxide film 13 is entirely etched away.

At this moment, the width of groove L3 is made larger than L2 by the dimension of the side wall oxide film 15 which has been removed (L3>L2). Further, since both oxide film 15 and pad oxide film 13 are etched at almost the same etching rate, an excessive etching of the pad oxide film 13 located below the side wall oxide film 15 and side wall nitride film 16 can be prevented, thus making it possible to prevent the generation of a recessed portion at the portion of pad oxide film 13.

Since the side walls of the dummy gate pattern 14 are completely covered by an oxide film at the occasion of removing the dummy gate pattern 14 according to the aforementioned method, the dummy gate pattern 14 can be removed using a stable process which is not severe in conditions. Further, due to the existence of oxide film on the side wall of the groove, the set-back of the side wall insulating film 16 can be avoided at the occasion of removing the pad oxide film 13, thus making it possible to control the dimension (L4) of the gate electrode to be formed in a subsequent step. Namely, the ultimate dimension of gate electrode (L4) can be determined by the total of the L3 and a dimension which is twice the thickness (Tox) of gate insulating film (L4=L3+(2×Tox)). The dimension L3 can be controlled through the degree of oxidation (oxide film thickness) of the dummy gate pattern 14 and through the degree of etching (the degree of overetching) of the pad oxide film 13, so that the L4 can be made equal to or smaller than the width L of the dummy gate pattern.

Figure 6F:
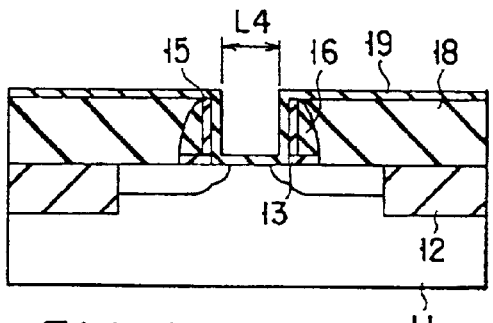

Then, as shown in FIG. 6F, a gate insulating film 19 consisting of a CVD-SiO$_2$ film (about 3 nm in film thickness) or consisting of a dielectric film with high dielectric constant (for example, Ta$_2$O$_5$ film, 20 nm in film thickness) is entirely deposited. When the gate insulating film 19 is formed of a dielectric film with high dielectric constant, a thin SiO$_2$ film (1 nm for instance) or a film which can be formed directly on the surface of Si in a NH$_3$ gas atmosphere by means of RTP (Rapid Thermal Process) may be interposed below the gate insulating film 19 so as to make it difficult to generate an interfacial level between the gate insulating film 19 and the Si.

As for the gate insulating film 19, a laminate film comprising a CVD-SiON$_x$ film (oxynitride film) or a CVD-Si$_3$N$_4$ film may be employed. It is possible in such a case to perform a densification of film through a heat treatment after the deposition of film by means of the RTP under the conditions of about 10 seconds and 1,000° C. in temperature. When the film is densified in this manner, the interfacial level of the Si interface can be reduced or the leak current can be minimized, i.e. the insulating properties of the insulating film can be improved.

When a high dielectric constant film is employed as a gate insulating film, the effective film thickness of the gate insulating film can be decreased without inviting an increase in leak current or a deterioration of dielectric strength, whereby the short channel effect of transistor can be suppressed. Moreover, it is also possible to increase the drain current or to improve the cut-off property.

Figure 6G:
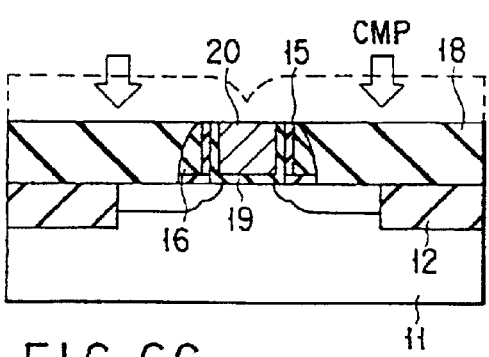

Then, as shown in FIG. 6G, a gate electrode 20 consisting of a metallic film (a Ru film, a TiN film, a W film, a tungsten nitride film (WN$_x$), a laminate film comprising any of these metallic films such as W/TiN) is entirely deposited. Of course, it is possible to employ an impurity-doped poly-Si film as a gate electrode when a laminate film comprising a CVD-SiO$_2$, a CVD-SiON film or a CVD-Si$_3$N$_4$ is employed as a gate insulating film.

After a gate insulating film 19 and a metal electrode 20 are entirely deposited, the CMP is performed under a condition suited for the metallic material thereby to obtain a structure where these gate insulating film 19 and metal electrode 20 are buried in the groove from which the dummy gate pattern has already been removed in the previous step. In this case, the SiO$_2$ film 18 and the gate insulating film 19 act as a stopper at the occasion of the CMP of the metal film. The gate insulating film 19 may be left remain on the surface of the SiO$_2$ film 18.

The width of gate electrode (L4 shown in FIG. 6F) may be made smaller than the width L1 of the dummy gate pattern 14 shown in FIG. 6A by a dimension corresponding to twice the film thickness of the gate insulating film 19 (however, L1=L3). Namely, if the minimum dimension to be determined depending on a lithography adopted is defined as L (in this case, assumed as 0.15 μm) and the thickness of the gate insulating film is assumed as being 0.02 μm, the width of gate electrode may be made smaller than the width L by a dimension corresponding to twice the film thickness of the gate insulating film (0.02 μm×2=0.04 μm). Therefore, it is possible to obtain a gate electrode having a width (L4) of 0.11 μm even though the lower limit according to the lithography is 0.15 μm.

Namely, this method is featured in that the length of channel of transistor can be made smaller than the dimension to be determined depending on a lithography adopted.

It is of course possible to make the width of gate electrode substantially identical with the L1 shown in FIG. 6A by adjusting the magnitude of etching of the pad oxide film 13 or the dimension of film thickness of the oxide film 15 of the amorphous Si film while taking into consideration the fact that the length of channel is shortened by a dimension corresponding to twice the film thickness of the gate insulating film. When a high dielectric constant film such as Ta$_2$O$_5$ film is employed, the actual film thickness becomes relatively large, so that the length of L4 can be fairly shortened.

Figure 6H:
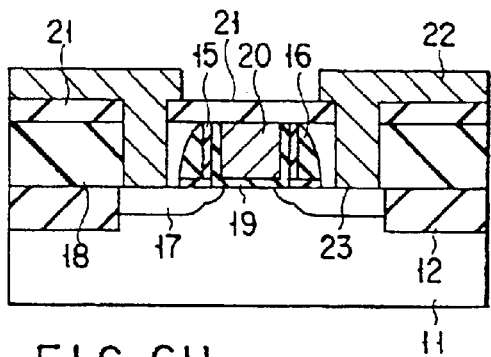

Then, as shown in FIG. 6H, an interlayer insulating film 21 consisting of SiO$_2$ is entirely deposited to a thickness of about 200 nm, and then a contact hole 23 extending to the source/drain regions 17 as well as to the gate electrode 20 is formed in the interlayer insulating film 21. Thereafter, an Al layer is deposited filling the contact hole 23 with the Al layer and patterned to form a wiring 22. Subsequently, a passivation film (not shown) is entirely deposited to obtain a fundamental structure of transistor.

According to this manufacturing method, it is possible, by constructing the dummy gate pattern with an amorphous Si having small grain diameter, to minimize the roughness of the edge of pattern of amorphous Si film as the Si film is patterned. Further, since the side walls of the dummy gate pattern are completely covered by an oxide film at the occasion of removing the dummy gate pattern, the dummy gate pattern can be removed using a stable process which is not severe in conditions. As a result, the dimension of the gate electrode to be formed in a subsequent step can be easily controlled.

Further, due to the existence of oxide film on the side wall of the groove, the set-back of the side wall insulating film can be avoided at the occasion of removing the pad oxide film, thus making it possible to control the dimension of the gate electrode to be formed in a subsequent step. Furthermore, since both oxide film formed on the side wall of groove and pad oxide film are both etched at almost the same etching rate, an excessive etching of the pad oxide film located below the side wall oxide film and side wall nitride film can be prevented, thus making it possible to prevent the generation of a recessed portion at the portion of pad oxide film.

Since the gate electrode can be worked by means of the CMP which is free from the problem of plasma damage, it is possible to avoid any damage (dielectric breakdown of the gate insulating film, etc.) that might be resulted from a plasma discharging process such as the RIE. Moreover, since a high temperature heat treatment such as the activation of the ion implantation region and the reflow processing can be performed prior to the formation of a gate insulating film (a laminate film comprising a high dielectric constant film), the deterioration of gate insulating film such as an increase of leak current or a failure of dielectric strength can be avoided.

Since the side walls of the gate electrode is covered by the oxide film of amorphous Si, an excellent dielectric strength can be maintained between the gate electrode and the substrate or between the gate electrode and the source/drain regions without necessitating a post oxidation.

Although the source/drain regions are formed prior to the formation of the gate electrode, the gate electrode can be formed in a self-aligned manner in the source/drain regions. Namely, both of the gate electrode and the source/drain regions can be formed in a self-aligned manner as in the case of prior art. Further, the formation of a channel ion implantation region for controlling the threshold voltage (Vth) of transistor can be performed only at the channel region, so that the junction leak or junction capacitance of the source/drain to the substrate can be minimized. Since this channel ion implantation region is kept free from a high temperature heat treatment such as an annealing for activating the source/drain regions, it is possible to form and maintain an ideal channel impurity profile in relative to the suppression of short channel effect.

Since the length of channel of transistor can be made smaller than the dimension to be determined depending on the limitation of lithography by a dimension corresponding to twice the film thickness of a high dielectric constant film to be employed as the gate insulating film, it is possible, due to a shortening of channel, to improve the performance of transistor. Further, since the gate insulating film is formed using a deposition film formed through the CVD, etc., a minute recessed portion at the corner (Si surface) of STI (Shallow Trench Isolation) (a gate insulating film and a gate electrode may be formed at this minute recessed portion thereby forming a parasitic transistor to invite a problem of changes in threshold value of transistor) can be buried with the deposition film, so that the formation of, such a parasitic transistor at the corner portion can be inhibited, thus making it possible to suppress any non-uniformity of threshold value of transistor.

For the high dielectric constant film, (Ba,Sr)TiO$_3$ film can be used instead of Ta$_2$O$_5$ film. Other films such as PZT are also possible to use as a deposition type gate dielectric film.

Next, a second example of this invention will be explained.

First of all, a first specific embodiment of this second example will be explained with reference to FIGS. 7A to 7J showing cross-sectional views for explaining the manufacturing process.

Figure 7A:
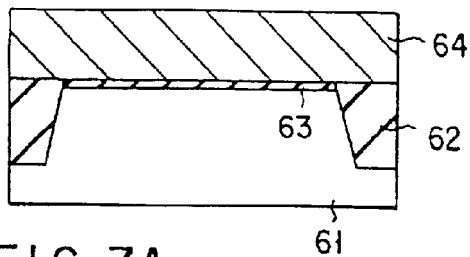
FIGS. 7A to 7J are cross-sectional views showing in stepwise a method of manufacturing a semiconductor device according to a first embodiment of a second example of this invention.

First of all, as shown in FIG. 7A, a SiO$_2$ film 63 (dummy insulating film) having a thickness of about 10 nm is formed on the surface of a predetermined element-forming region of Si substrate 61 which is surrounded by a trench-type element isolation region (Shallow Trench Isolation) 62. Then, a poly-Si film 64 for forming a dummy gate pattern having a thickness of about 300 nm is deposited on the surface of SiO$_2$ film 63.

Figure 7B:
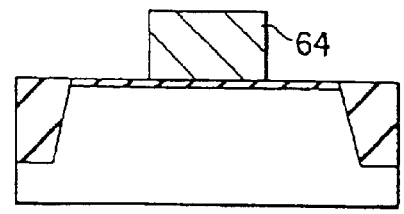

Subsequently, as shown in FIG. 7B, the poly-Si film 64 is worked into a dummy gate pattern by means of lithography and RIE for instance.

Figure 7C:
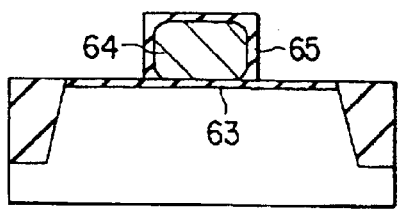

Then, as shown in FIG. 7C, the dummy gate pattern is thermally oxidized by means of RTO (Rapid Thermal Oxidation) for 60 seconds at a temperature of 1,000° C. thereby to round the edge portion of the dummy gate pattern 64, and at the same time, the film thickness of the SiO$_2$ film 63 disposed below the edge portion is allowed to increase while allowing a SiO$_2$ film 65 to be formed on the exposed surface of the dummy gate pattern.

Figure 7D:
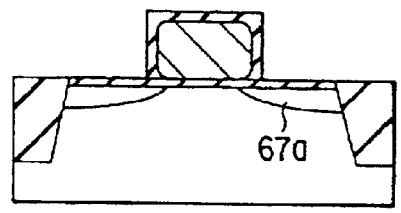

Then, as shown in FIG. 7D, using the poly-Si film 64/the SiO$_2$ film 65 as a mask, phosphorus ion (P+) is implanted with an acceleration voltage of 70 kev and at a dosage of $4\times10^{13}$ cm$^{-2}$, thereby to form an n$^-$-type diffusion region 67a.

Figure 7E:
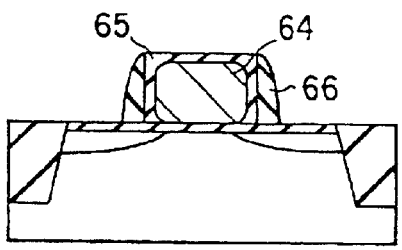

Then, as shown in FIG. 7E, after an Si$_3$N$_4$ film is entirely deposited, the entire surface is subjected to an RIE process, thus leaving a portion of the Si$_3$N$_4$ film on the side wall of the dummy gate pattern 64 (or so-called Si$_3$N$_4$ film-leaving on side wall portion), whereby forming a Si$_3$N$_4$ film 66 having a film thickness of 20 nm on the side wall of the dummy gate pattern 64.

Figure 7F:
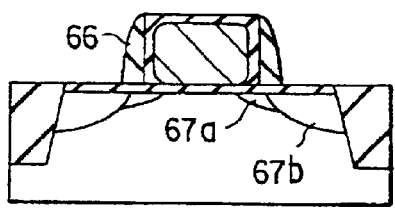

Subsequently, as shown in FIG. 7F, arsenic ion (As+) is implanted for instance with an acceleration voltage of 30 keV and at a dosage of $5\times10^{15}$ cm$^{-2}$ thereby to form an n$^+$-type diffusion region 67b whereby completing the LDD structure.

Figure 7G:
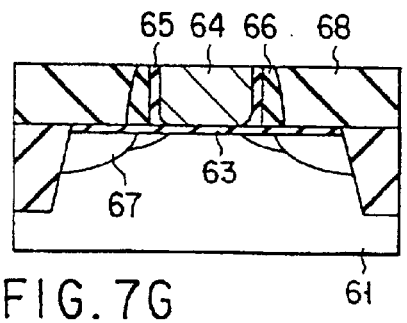

Subsequently, as shown in FIG. 7G, a CVD-SiO$_2$ film 68 to be formed into an interlayer insulating film is entirely deposited to a thickness of 300 nm and then subjected to a densification treatment for 30 minutes in a N$_2$ gas atmosphere at a temperature of 800° C. Thereafter, the entire surface is subjected to CMP (Chemical Mechanical Polishing) to flatten the upper surface of the resultant structure thereby to allow the surface of the dummy gate pattern 64 to be exposed.

Figure 7H:
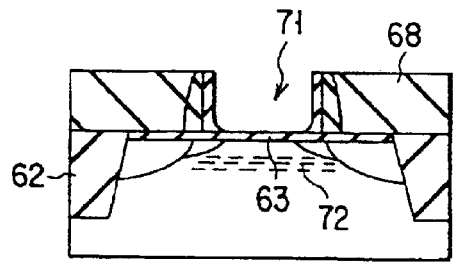

Then, as shown in FIG. 7H, after a groove 71 is formed by selectively removing the exposed poly-Si film 64, only a channel region is subjected to a channel ion implantation using, as a mask, a resist and films, such as a resist pattern (not shown) formed at a desired region, the SiO$_2$ film 68, the side wall insulating film (Si$_3$N$_4$ film) 66 and the SiO$_2$ film 65. The activation of this channel impurity region 72 can be performed by means of the RTA (Rapid Thermal Anneal), i.e. a heat treatment at a temperature of 800° C. for 10 seconds or so.

Figure 7I:
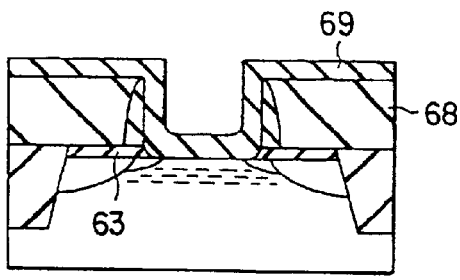

Then, as shown in FIG. 7I, the SiO$_2$ film 63 and the SiO$_2$ film 65,are removed by making use of a dilute hydrofluoric acid treatment in such a manner that these films are left remained only the edge portions. At this occasion, since the SiO$_2$ film 63 is left remained at the edge portion, any recess is not formed therein. Subsequently, a gate insulating film 69 consisting of a high dielectric constant film (for example, Ta$_2$O$_5$ film, 20 nm in film thickness) is entirely deposited to a thickness of 20 nm.

Figure 7J:
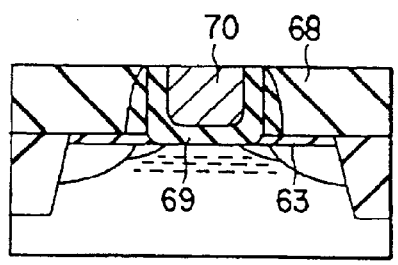

Then, as shown in FIG. 7J, after a metal such as Ru is entirely deposited, the resultant upper surface is entirely abraded by means of CMP thereby to obtain a structure where a high dielectric constant gate insulating film 69 and a gate electrode 70 consisting of a metallic film are buried in the groove from which the dummy gate pattern 64 has already been removed in the previous step.

Subsequently, an interlayer insulating film consisting of an SiO$_2$ film (not shown) is entirely deposited to a thickness of about 200 nm, and then a contact hole 23 extending to the source/drain-regions 67 as well as to the gate electrode 70 is formed in the interlayer insulating film. Thereafter, an Al layer (not shown) is deposited filling the contact hole 23 with the Al layer and patterned to form a wiring. Subsequently, a passivation film (not shown) is entirely deposited to obtain a fundamental structure of transistor.

Next, a second specific embodiment of the second example will be explained with reference to FIGS. 8A to 8J showing cross-sectional views for explaining the manufacturing process.

Figure 8A:
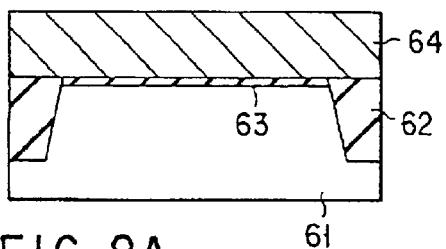
FIGS. 8A to 8J are cross-sectional views showing in stepwise a method of manufacturing a semiconductor device according to a second embodiment of a second example of this invention.

First of all, as shown in FIG. 8A, a $SiO_2$ film 63 (dummy insulating film) having a thickness of about 10 nm is formed on the surface of a predetermined element-forming region of Si substrate 61 which is surrounded by a trench-type element isolation region 62. Then, a poly-Si film 64 for forming a dummy gate pattern having a thickness of about 300 nm is deposited on the surface of $SiO_2$ film 63.

Figure 8B:
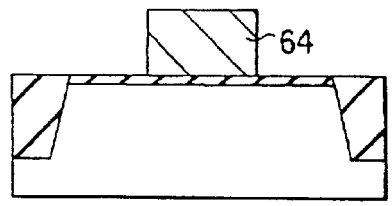

Subsequently, as shown in FIG. 8B, the poly-Si film 64 is worked into a dummy gate pattern by means of lithography and RIE for instance.

Figure 8C:
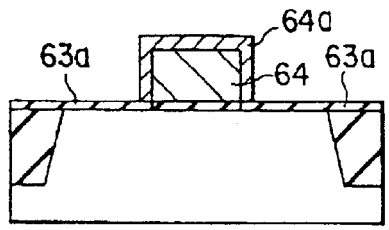

Then, as shown in FIG. 8C, the dummy gate pattern is thermally nitrided by means of RTN (Rapid Thermal Nitridation) for 60 seconds at a temperature of 1,000° C., or subjected to a nitrogen ion implantation (the ion to be implanted may be carbon ion) with an acceleration voltage of 30 keV and at a dosage of $1\times10^{14}$ $cm^{-2}$, thereby to form a nitrogen-containing portion 63a in the $SiO_2$ film 63. At this occasion, nitrogen is introduced also into the $SiO_2$ film 63 disposed below the edge portion of the dummy gate pattern 64. By the way, a nitrogen-containing portion 64a is also formed in the surface region of the poly-Si film 64.

Figure 8D:
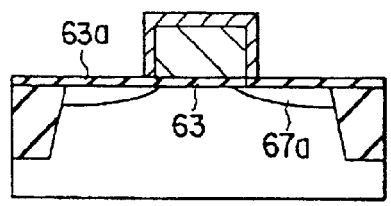

Then, as shown in FIG. 8D, using the poly-Si film 64 (including the nitrogen-containing portion 64a) as a mask, phosphorus ion (P+) is implanted with an acceleration voltage of 70 keV and at a dosage of $4\times10^{13}$ $cm^{-2}$, thereby to form an $n^-$-type diffusion region 67a.

Figure 8E:
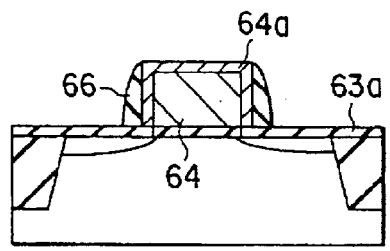

Then, as shown in FIG. 8E, after an $Si_3N_4$ film is entirely deposited, the entire surface is subjected to an RIE process, thus leaving a portion of the $Si_3N_4$ film on the side wall of the dummy gate pattern 64 (or so-called $Si_3N_4$ film-leaving on side wall portion), whereby forming a $Si_3N_4$ film 66 having a film thickness of 20 nm on the side wall of the dummy gate pattern 64.

Figure 8F:
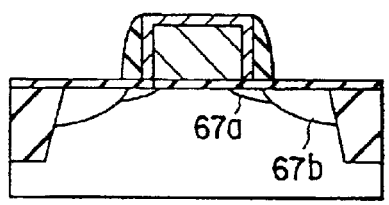

Subsequently, as shown in FIG. 8F, arsenic ion (As+) is implanted for instance with an acceleration voltage of 30 keV and at a dosage of $5\times10^{15}$ $cm^{-2}$ thereby to form an $n^+$-type diffusion region 67b whereby completing the LDD structure.

Figure 8G:
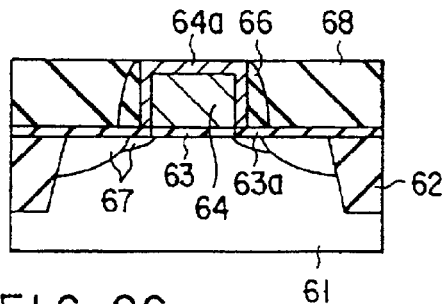

Subsequently, as shown in FIG. 8G, a CVD-$SiO_2$ film 68 to be formed into an interlayer insulating film is entirely deposited to a thickness of 300 nm and then subjected to a densification treatment for 30 minutes in a $N_2$ gas atmosphere at a temperature of 800° C. Thereafter, the entire surface is subjected to CMP (Chemical Mechanical Polishing) to flatten the upper surface of the resultant structure thereby to allow the surface of the dummy gate pattern 64 (including the nitrogen-containing portion 64a) to be exposed.

Figure 8H:
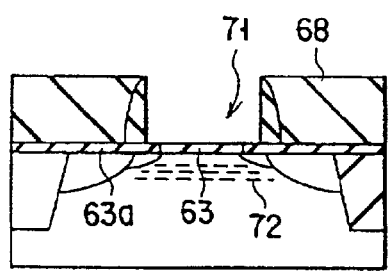

Then, as shown in FIG. 8H, after a groove 71 is formed by selectively removing the exposed dummy gate pattern 64, only a channel region is subjected to a channel ion implantation using, as a mask, a resist and films, such as a resist pattern (not shown) formed at a desired region, the $SiO_2$ film 68 and the side wall insulating film ($Si_3N_4$ film) 66. The activation of this channel impurity region 72 can be performed by means of the RTA (Rapid Thermal Anneal), i.e. a heat treatment at a temperature of 800° C. for 10 seconds or so.

Figure 8I:
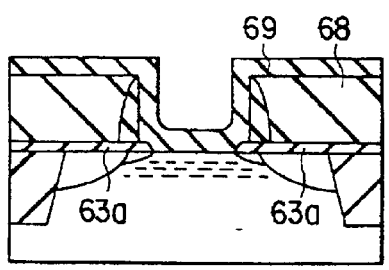

Then, as shown in FIG. 8I, the $SiO_2$ film 63 is removed by making use of a dilute hydrofluoric acid treatment in such a manner that the film is left remained only the edge portions. At this occasion, since the $SiO_2$ film 63 is provided with the nitrogen-containing portion 63a at the edge portions, any recess is not formed at the edge portions. Subsequently, a gate insulating film 69 consisting of a high dielectric constant film (for example, $Ta_2O_5$ film) is entirely deposited to a thickness of 20 nm.

Figure 8J:
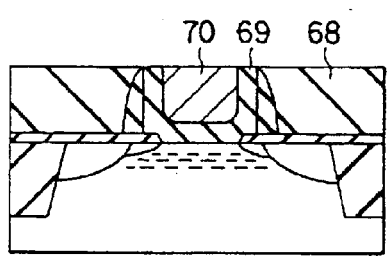

Then, as shown in FIG. 8J, after a metal such as Ru is entirely deposited, the resultant upper surface is entirely abraded by means of CMP thereby to obtain a structure where a high dielectric constant gate insulating film 69 and a gate electrode 70 consisting of a metallic film are buried in the groove from which the dummy gate pattern 64 has already been removed in the previous step.

Subsequently, an interlayer insulating film consisting of an $SiO_2$ film (not shown) is entirely deposited to a thickness of about 200 nm, and then a contact hole extending to the source/drain regions 67 as well as to the gate electrode 70 is formed in the interlayer insulating film. Thereafter, an Al layer (not shown) is deposited filling the contact hole with the Al layer and patterned to form a wiring. Subsequently, a passivation film (not shown) is entirely deposited to obtain a fundamental structure of transistor.

Next, a third specific embodiment of the second example will be explained with reference to FIGS. 9A to 9J showing cross-sectional views for explaining the manufacturing process.

Figure 9A:
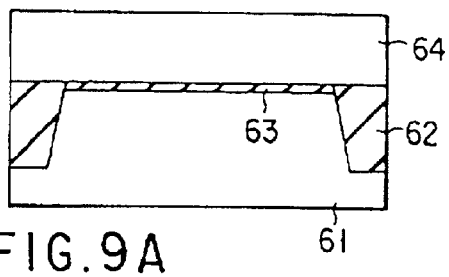
FIGS. 9A to 9J are cross-sectional views showing in stepwise a method of manufacturing a semiconductor device according to a third embodiment of a second example of this invention.

First of all, as shown in FIG. 9A, a $SiO_2$ film 63 (dummy insulating film) having a thickness of about 10 nm is formed on the surface of a predetermined element-forming region of Si substrate 61 which is surrounded by a trench-type element isolation region 62. Then, a poly-Si film 64 for forming a dummy gate pattern having a thickness of about 300 nm is deposited on the surface of $SiO_2$ film 63.

Figure 9B:
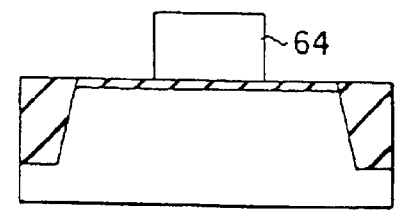

Subsequently, as shown in FIG. 9B, the poly-Si film 64 is worked into a dummy gate pattern by means of lithography and RIE for instance.

Figure 9C:
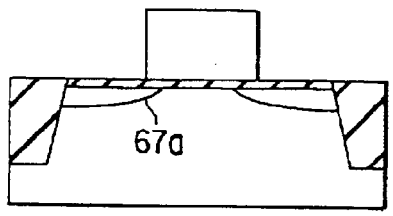

Then, as shown in FIG. 9C, using the poly-Si film (dummy gate pattern) 64 as a mask, phosphorus ion (P+) is implanted with an acceleration voltage of 70 keV and at a dosage of $4\times10^{13}$ $cm^{-2}$, thereby to form an $n^-$-type diffusion region 67a.

Figure 9D:
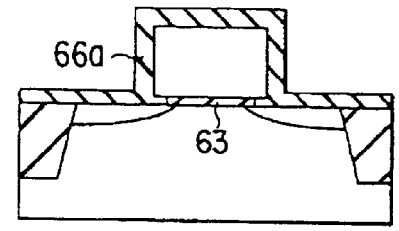

Then, as shown in FIG. 9D, a portion of dummy gate insulating film 63 located at the edge portion is removed by making use of a dilute hydrofluoric acid treatment, and then an $Si_3N_4$ film 66a is entirely deposited. At this occasion, as shown in FIG. 9D, the etched portion below the edge portion is also filled with the $Si_3N_4$ film 66a.

Figure 9E:
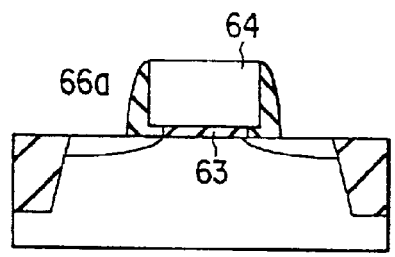

Then, as shown in FIG. 9E, the entire surface is subjected to an RIE process, thus leaving a portion of the $Si_3N_4$ film on the side wall of the dummy gate pattern 64 (or so-called $Si_3N_4$ film-leaving on side wall portion), whereby forming a $Si_3N_4$ film 66a having a film thickness of 20 nm on the side wall of the dummy gate pattern 64.

Figure 9F:
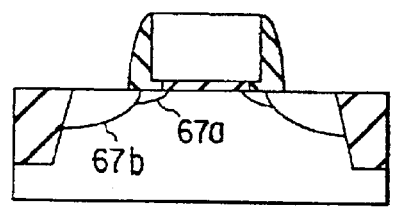

Subsequently, as shown in FIG. 9F, arsenic ion (As+) is implanted for instance with an acceleration voltage of 30 keV and at a dosage of $5\times10^{15}$ $cm^{-2}$ thereby to form an $n^+$-type diffusion region 67b whereby completing the LDD structure.

Figure 9G:
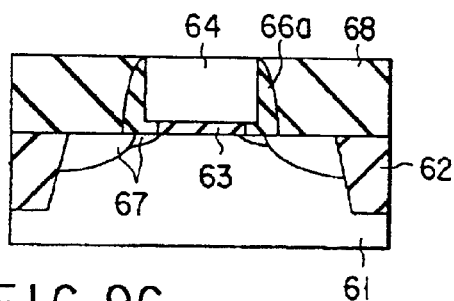

Subsequently, as shown in FIG. 9G, a CVD-$SiO_2$ film 68 to be formed into an interlayer insulating film is entirely deposited to a thickness of 300 nm and then subjected to a densification treatment for 30 minutes in a $N_2$ gas atmosphere at a temperature of 800° C. Thereafter, the entire surface is subjected to CMP (Chemical Mechanical Polishing) to flatten the upper surface of the resultant structure thereby to allow the surface of the dummy gate pattern 64 (including the nitrogen-containing portion 64a) to be exposed.

Figure 9H:
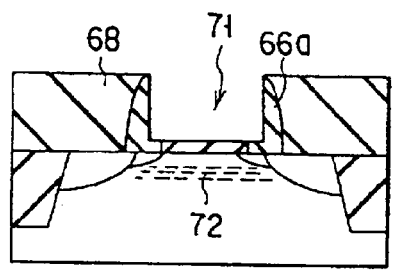

Then, as shown in FIG. 9H, after a groove 71 is formed by selectively removing the exposed dummy gate pattern 64, only a channel region is subjected to a channel ion implantation using, as a mask, a resist and films, such as a resist pattern (not shown) formed at a desired region, the $SiO_2$ film 68 and the side wall insulating film ($Si_3N_4$ film) 66a. The activation of this channel impurity region 72 can be performed by means of the RTA (Rapid Thermal Anneal), i.e. a heat treatment at a temperature of 800° C. for 10 seconds or so.

Figure 9I:
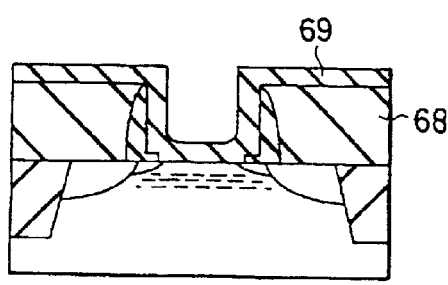

Then, as shown in FIG. 9I, the $SiO_2$ film 63 is removed by making use of a dilute hydrofluoric acid treatment in such a manner that the $Si_3N_4$ film 66a existing at the edge portions is left remained. At this occasion, since the $Si_3N_4$ film 66a is formed at the edge portions, any recess is not formed at the edge portions. Subsequently, a gate insulating film 69 consisting of a high dielectric constant film (for example, $Ta_2O_5$ film) is entirely deposited to a thickness of 20 nm.

Figure 9J:
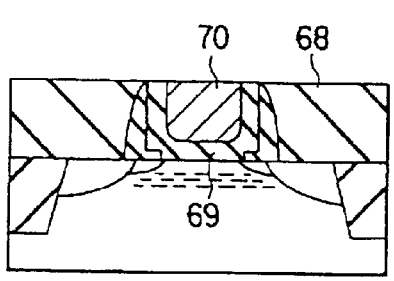

Then, as shown in FIG. 9J, after a metal such as Ru is entirely deposited, the resultant upper surface is entirely abraded by means of CMP thereby to obtain a structure where a high dielectric constant gate insulating film 69 and a gate electrode 70 consisting of a metallic film are buried in the groove from which the dummy gate pattern 64 has already been removed in the previous step.

Subsequently, an interlayer insulating film consisting of an $SiO_2$ film (not shown) is entirely deposited to a thickness of about 200 nm, and then a contact hole extending to the source/drain regions 67 as well as to the gate electrode 70 is formed in the interlayer insulating film. Thereafter, an Al layer (not shown) is deposited filling the contact hole with the Al layer and patterned to form a wiring. Subsequently, a passivation film (not shown) is entirely deposited to obtain a fundamental structure of transistor.

As explained above, according to the second example of this invention, since it is possible to allow the insulating film portion disposed at the lower edge portion of gate electrode to become thick and at the same time, to allow the lower edge portion of gate electrode to become large in radius of curvature, the reliability of the gate insulating film at the edge portions can be improved. Further, since the thickening and round-shaping of the edge portions can be performed in a self-aligned manner in relative to the gate electrode and to the source/drain regions, it is possible to realize a semiconductor element having an uniform property and a high reliability.

It should be appreciated that this invention is not confined to the aforementioned various examples, but can be variously modified within the spirit of this invention.

Since it is possible according to this invention to prevent the generation of a recessed portion that might be generated due to a lateral etching of a dummy film at the occasion of removing the dummy film, a deterioration in property or reliability of transistor that might be brought about due to the recessed portion at the lower edge portion of the gate electrode can be prevented.

Furthermore, since the dummy gate pattern and the dummy film can be removed by way of a stable process without accompanying any severe conditions, it possible to improve the dimension controllability of the groove portion to be filled with a gate electrode, i.e. the dimension controllability of the gate electrode.

Next, a third specific embodiment of the second example will be explained with reference to FIGS. 10A to 10I showing cross-sectional views for explaining the manufacturing process.

Figure 10A:
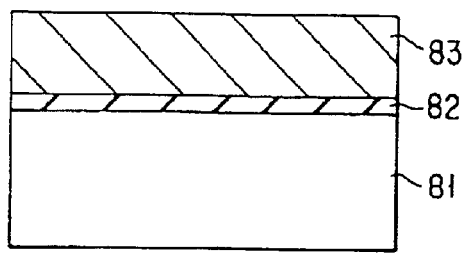
FIGS. 10A to 10I are cross-sectional views showing in stepwise a method of manufacturing a semiconductor device according to a third example of this invention.

First of all, as shown in FIG. 10A, a $SiO_2$ film 82 having a thickness of 5 nm is formed on the surface of a predetermined transistor-forming region of Si substrate 81 provided with a trench-type element isolation layer (not shown). Then, a poly-Si film 83 for forming a dummy gate pattern having a thickness of about 300 nm is deposited on the surface of $SiO_2$ film 82.

Figure 10B:
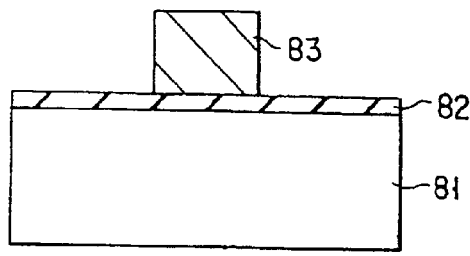

Subsequently, as shown in FIG. 10B, the poly-Si film 83 is worked into a dummy gate pattern by means of lithography and RIE for instance.

Figure 10C:
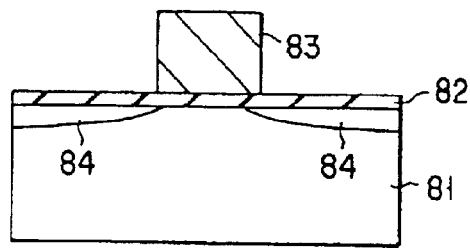

Then, as shown in FIG. 10C, using the dummy gate pattern 83 as a mask, phosphorus ion (P+) is implanted at a dosage of $4 \times 10^{13}$ cm$^{-2}$, thereby to form an n$^-$-type source/drain region 84.

Then, after an $Si_3N_4$ film is entirely deposited, the resultant surface is subjected to an overall etch-back, thereby forming an $Si_3N_4$ film side wall insulating film 85 on the side wall of the dummy gate pattern 83.

Figure 10D:
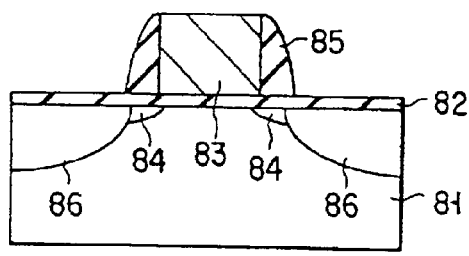

Then, arsenic ion (As+) is implanted for instance at a dosage of $5 \times 10^{15}$ cm$^{-2}$ thereby to form an n$^+$-type diffusion region 86 whereby completing the LDD structure shown in FIG. 10D. Subsequently, the resultant structure is subjected to an annealing at a temperature of 1,000° C. for 30 seconds thereby to activate the source/drain regions.

Figure 10E:
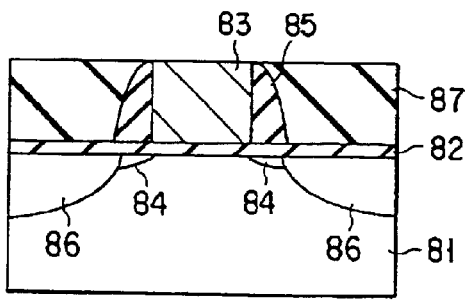

Subsequently, as shown in FIG. 10E, a CVD-$SiO_2$ film 87 is entirely deposited to a thickness of 300 nm and then subjected to a densification treatment for 30 minutes in a $N_2$ gas atmosphere at a temperature of 800° C. Thereafter, the entire surface is subjected to CMP (Chemical Mechanical Polishing) to flatten the upper surface of the resultant structure thereby to allow the surface of the dummy gate pattern 83 to expose.

Figure 10F:
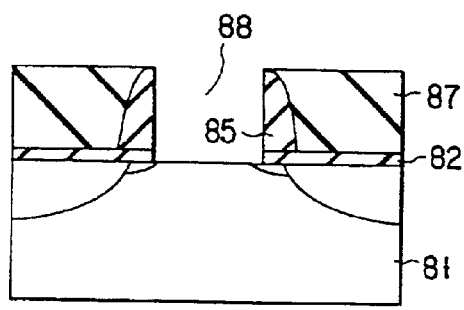
Figure 10G:
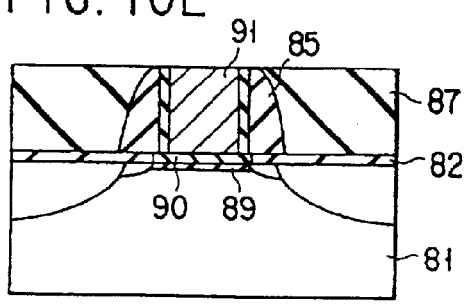

Then, as shown in FIG. 10F, the exposed dummy gate pattern 83 is selectively removed, and the $SiO_2$ film 82 disposed below the dummy gate pattern 83 is also removed thereby to form a groove 88 for forming a gate insulating film and a gate electrode.

Then, an oxynitride film 89 having a thickness of 1.5 nm is formed on the surface of the Si substrate 81 by making use of an NO gas. Thereafter, a $Ta_2O_5$ film 90 having a thickness of 5 nm for instance and a Ru film 91 (a gate electrode) having a thickness of 300 nm are deposited, and then entirely subjected to CMP process thereby to obtain a transistor structure shown in FIG. 10G wherein a gate insulating film consisting of the oxynitride film 89 and the $Ta_2O_5$ film 90, and a gate electrode 91 consisting of the Ru film 91 are buried in the groove 88. Subsequently, the deposition of an interlayer insulating film, the opening of a contact hole and the formation of wirings are performed.

Figure 10H:
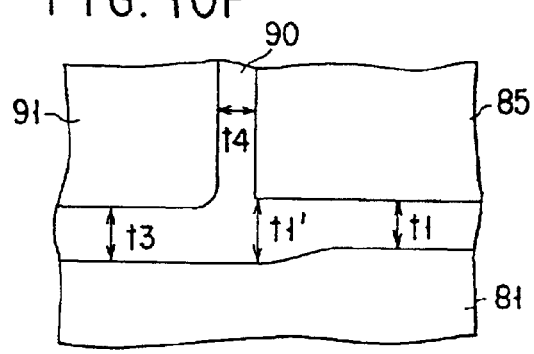

In this case, as shown in FIG. 10H, the thickness t3 of the gate insulating film to be formed at the bottom surface of the gate electrode 91 is a total of the thickness (1.5 nm) of the oxynitride film 89 and the thickness (5 nm) of the $Ta_2O_5$ film 90, i.e. 6.5 nm. While the thickness t4 of the $Ta_2O_5$ film 90 to be formed on the side wall of the gate electrode 91 is 5 nm. On the other hand, the thickness t1 of the $SiO_2$ film 82 is 5 nm. Accordingly, there is a relationship regarding the film thickness among these films, i.e. t3+t4>t1. It is also designed that there would be a relationship of t3+t4>t1' wherein t1' represents a distance between the lower edge portion of the $Si_3N_4$ film 85 and the surface of the Si substrate 81.

Figure 10I:
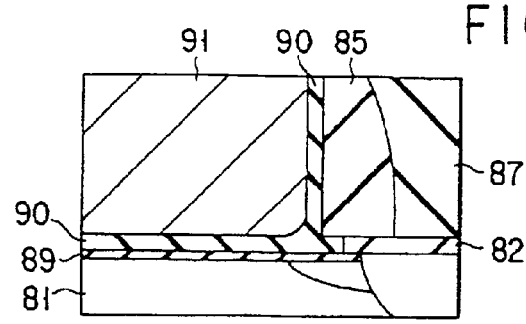

As shown in FIG. 10I, according to this structure, the recessed portion that may be formed at the occasion of removing the $SiO_2$ film 82 disposed below the dummy gate pattern 83 can be completely filled with a gate insulating film, so that the shape of the lower edge portion of the gate electrode can be formed to, have a large radius of curvature, thus making it possible to realize a transistor structure which is featured as having a highly reliable gate edge portion.

As explained above, according to the third example of this invention, the recessed portion that may be formed between the surface of silicon substrate and the side wall insulating film at the lower edge portion of the gate can be completely filled with a gate insulating film, so that the shape of the lower edge portion of the gate electrode can be formed to have a large radius of curvature. Accordingly, it is possible to realize a semiconductor device which is featured as having a gate edge portion of improved reliability.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a first insulating film selectively formed on a surface of said semiconductor substrate;

a gate insulating film selectively formed on a surface portion of said semiconductor substrate where said first insulating film is not formed, said gate insulating film including a first gate insulating film and a second gate insulating film formed between said semiconductor substrate and said first gate insulating film;

a gate electrode formed on said gate insulating film; and a second insulating film formed of the same material as the first gate insulating film and formed on a side wall of said gate electrode at the same time as said first gate insulating film; and a side wall insulating film which is formed on said second insulating film, wherein a total film thickness of said gate insulating film and said second insulating film is larger than a film thickness of said insulating film.

2. The semiconductor device according to claim 1, further comprising an interlayer insulating film having a groove and formed on said semiconductor substrate, and said gate electrode is formed in said groove.

3. The semiconductor device according to claim 1, wherein said first gate insulating film is a deposited film.

4. The semiconductor device according to claim 1, wherein said gate insulating film comprises metal oxide.

5. The semiconductor device according to claim 4, wherein said side wall insulating film comprises $Si_3N_4$.

6. The semiconductor device according to claim 1, wherein said gate electrode comprises metal.

* * * * *

UNITED STATES PATENT AND TRADEMARK OFFICE
CERTIFICATE OF CORRECTION

PATENT NO. : 6,787,827 B2
DATED : September 7, 2004
INVENTOR(S) : Inumiya et al.

It is certified that error appears in the above-identified patent and that said Letters Patent is hereby corrected as shown below:

Column 22,
Line 15, change "said insulating" to -- said first insulating --.

Signed and Sealed this

Fourth Day of January, 2005

JON W. DUDAS
*Director of the United States Patent and Trademark Office*